United States Patent [19]

Irwin et al.

[11] Patent Number: 5,095,287
[45] Date of Patent: Mar. 10, 1992

[54] PHASE LOCKED LOOP HAVING A CHARGE PUMP WITH RESET

[75] Inventors: James S. Irwin, Paige; David F. Moeller, Austin, both of Tex.

[73] Assignee: Motorola, Inc., Schaumburg, Ill.

[21] Appl. No.: 645,170

[22] Filed: Jan. 24, 1991

[51] Int. Cl.⁵ .............................................. H03L 7/093
[52] U.S. Cl. .................................. 331/1 A; 307/516; 328/133; 331/17; 331/27
[58] Field of Search ............... 331/1 A, 17, 25, 27; 307/516; 328/133, 134

[56] References Cited

U.S. PATENT DOCUMENTS

| | | | |
|---|---|---|---|
| 3,714,463 | 1/1973 | Lanne | 307/232 |
| 4,814,726 | 3/1989 | Byrd et al. | 331/1 A |
| 4,857,866 | 8/1989 | Tateichi | 331/1 A |

Primary Examiner—Siegfried H. Grimm
Attorney, Agent, or Firm—James L. Clingan, Jr.; Ray Warren

[57] ABSTRACT

The charge pump circuit of a phase locked loop has a sensing device, latch and charge pump. When there are contemporaneous up and down signals being produced by the charge pump, a reset signal is provided from the sensing device to a latch which is coupled between the input to the circuit and the pump. Input signals are then inhibited from reaching the charge pump.

7 Claims, 2 Drawing Sheets

PHASE LOCKED LOOP HAVING A CHARGE PUMP WITH RESET

FIELD OFF THE INVENTION

The present invention relates, in general, to charge pump devices for use in phase locked loops and, more particularly, to charge pump devices with reset.

BACKGROUND OF THE INVENTION

A charge pump is a device typically used to provide a control signal to a voltage controlled oscillator in a phase locked loop (PLL). In general, a phase locked loop operates by comparing the phases of a reference signal and a feedback signal in a phase detector. For this particular application, a tri-state phase detector such as the MC4044 manufactured by Motorola Inc. will be assumed. The phase detector then provides an output signal to a voltage controlled oscillator (VCO). If the reference and feedback signals are out of phase, the phase detector will adjust the output of the VCO, either up or down, until the two signals are in phase. This correction is typically accomplished by either charging or discharging a capacitor coupled between ground and the VCO input which acts as a low pass filter.

Since the phase detector typically does not provide sufficient drive current to achieve an adequate loop bandwidth, it is customary to include a charge pump, or current amplifier. The charge pump serves to increase the available drive current thereby increasing the loop bandwidth.

Ideally, the phase detector would be reset when the up and down signals contemporaneously appear at the output of their respective charge pump outputs. However, a problem arises because the reset logic of the phase detector is designed only for the phase detector itself and does not accommodate the additional delay from the charge pump. Since there is a finite and unpredictable time required from when the phase detector turns on the charge pump and the time when the output current flows, there will be a "dead zone" if no precautions are taken. If overly conservative measures are taken, usually by employing a time delay in the phase detector reset path, the minimum pulse width at zero phase error will be longer than desired with the result that more loop filtering is required to reduce the output pulse energy to an acceptable level. Doing so will undesirably slow the loop response to a frequency change request. The necessary compromise is never satisfying because of wide variations in processing and operating conditions.

One method of addressing this problem is provided in U.S. Pat. No. 4,814,726 issued on Mar. 21, 1989 to Byrd et al. In this patent, a reset line is coupled from the charge pump back to the phase detector. Whenever the pump up and pump down functions come on simultaneously, a reset signal is sent to the phase detector.

SUMMARY OF THE INVENTION

In a phase locked loop, or the like, a charge pump circuit is provided which has a sensing device to sense when there are contemporaneous up and down signals being produced. A reset signal is provided from the sensing device to a latch means which is coupled between the input to the device and the pump. Upon reset, the signals entering the device are blocked from the pump.

DETAILED DESCRIPTION OF THE DRAWINGS

Figure 1:
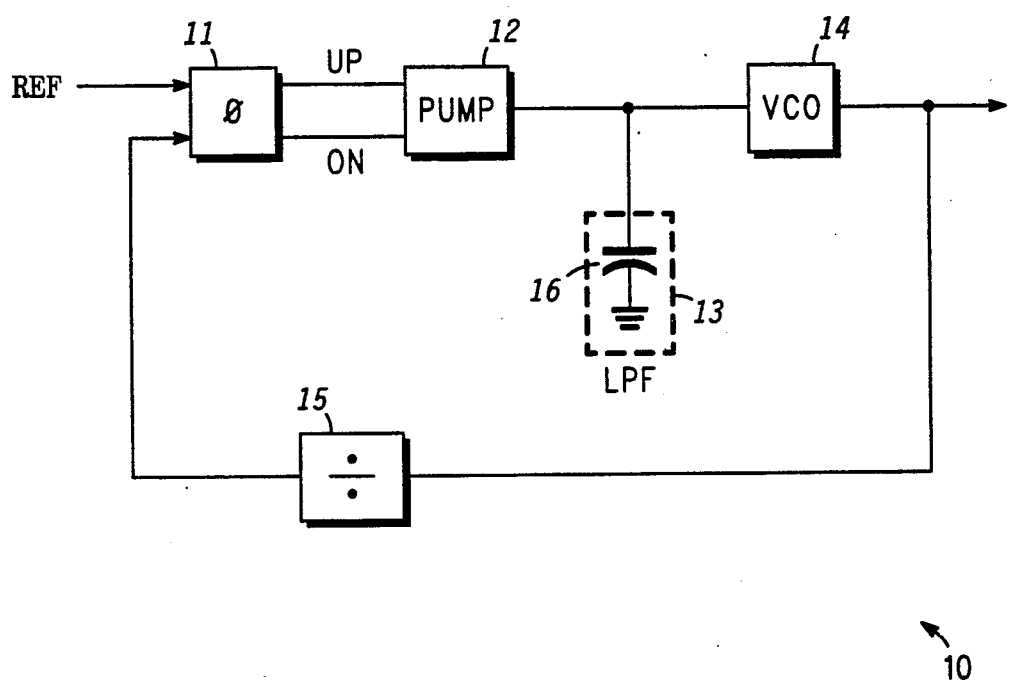
FIG. 1 is a block diagram of a phase locked loop having a charge pump embodying the present invention.

Referring initially to FIG. 1, a block diagram of a phase locked loop, generally designated 10, is illustrated. PLL 10 consists of a phase detector 11, a charge pump 12, a low pass filter (LPF) 13, a voltage controlled oscillator 14, and a feedback divider 15. The phases of a reference signal and a feedback signal are received and compared by phase detector 11. If the signals are out of phase, phase detector 11 will output a signal to charge pump 12 directing that the frequency of the output signal be increased or decreased as appropriate.

Charge pump 12, as directed by phase detector 11, will then cause a capacitor 16 of filter 13 to either charge, to cause an increase in the output frequency, or discharge, to cause a decrease in the output frequency. VCO 14, in response to the voltage provided at its input by LPF 13, will respond by increasing or decreasing the output frequency.

Figure 2:
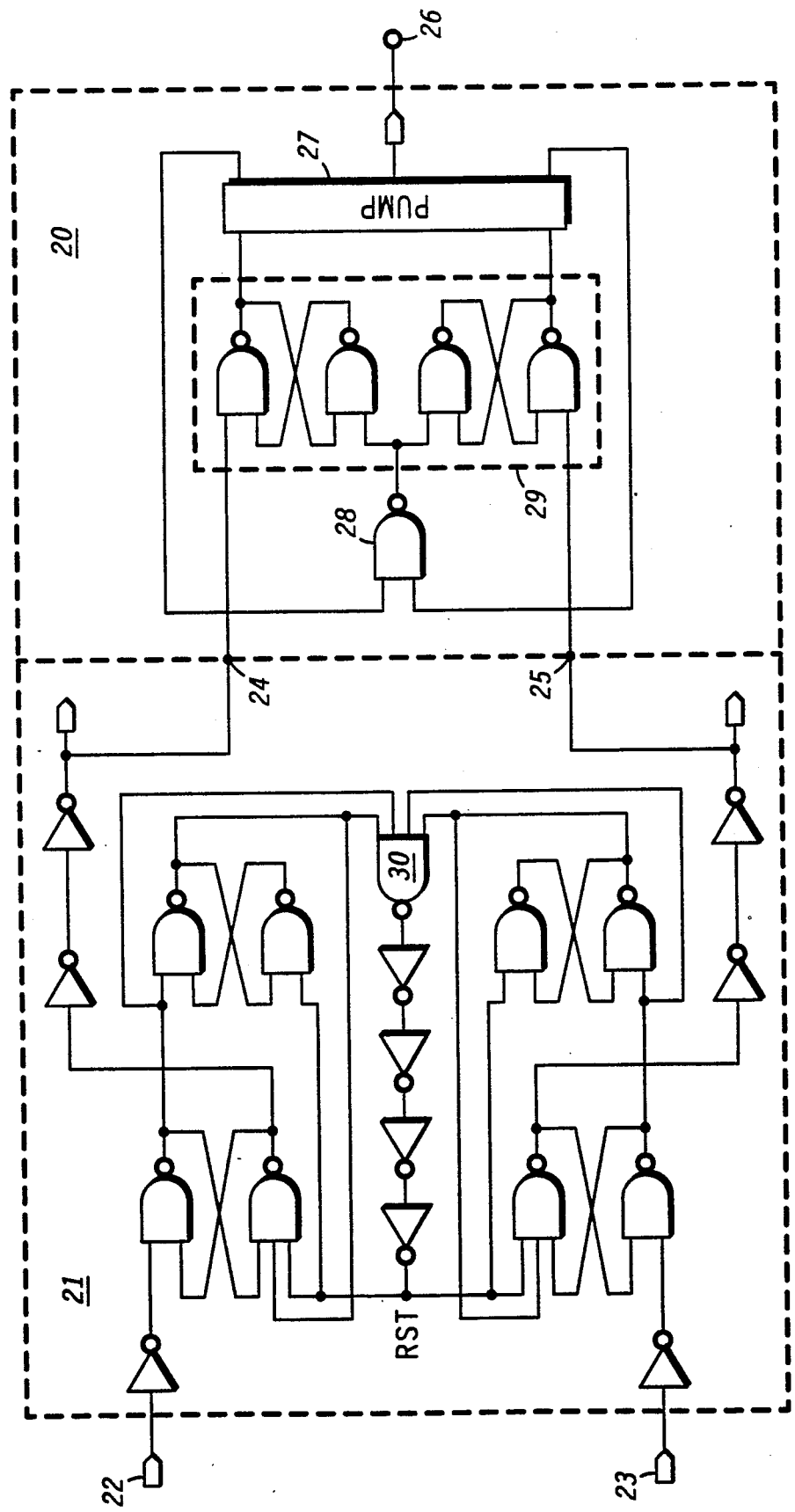
FIG. 2 is a block diagram of a charge pump embodying the present invention shown in conjunction with a phase detector.

Referring now to FIG. 2, a block diagram of a charge pump circuit, generally designated 20, as coupled to a phase detector, generally designated 21, is illustrated. The two signals to be compared in phase detector 21 are received at nodes 22 and 23. After the phases of the two signals are compared, signals indicating that the frequency of the VCO should be increased and/or decreased are transmitted to charge pump circuit 20 at nodes 24 and 25.

When these signals are received by charge pump circuit 20, they are processed and an output along line 26 either charges or discharges the capacitor of the low pass filter coupled between the VCO input and ground.

In addition to normal operation, a reset is determined by sensing the actual output pulse current rather than the input control signal. This will automatically compensate for uncontrollable variations of time delays. The up and down outputs of pump 27 are input to a NAND gate 28. When both of the up and down outputs are active, the NAND gate will send a signal to a latching network 29. This will activate the latch and reset charge pump circuit 20. The result will be that the phase detector instruction will be maintained until the desired output current conditions are met.

It should be noted that phase detector 21 is also provided with its own internal reset provided by NAND gate 30.

This type of charge pump structure allows more flexibility in the design of PLLs than the Byrd patent cited above. Since the phase detector and charge pump are separate stand alone blocks, each can be a separate block in a CAD design library. The independence of the two blocks significantly simplifies the testing of the parts on an integrated circuit. Furthermore, the structure described here has a dual output capability which allows the phase detector portion to still be used for lock detection and a "low drive" mode, with or without the added charge pump being active.

Thus, it will be apparent to one skilled in the art, upon reviewing the foregoing description, that there has been provided in accordance with the invention, a device that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A phase locked loop comprising:
   means for providing an output signal, said output signal having a frequency which is variable in response to a control signal;
   means for providing a reference signal;
   means for dividing said output signal to provide a divided signal;
   phase detector means for comparing the phases of said reference signal and said divided signal; and
   current generating means coupled to said phase detector means for providing said control signal, said current generating means including detection means for resetting said current generating means.

2. The phase locked loop of claim 1 wherein said current generating means comprises a current pump.

3. The phase locked loop of claim 1 wherein said detection means comprises:
   means for sensing a first current signal to provide a first sensed signal;
   means for sensing a second current signal to provide a second sensed signal; and
   means for providing a reset signal in response to said first and second sensed signals.

4. A phase locked loop having a current generating means comprising:
   a charge pump having first and second inputs and first and second outputs;
   first gate means having first and second inputs coupled to said first and second outputs of said charge pump, and a reset output; and
   latch means having first and second inputs coupled to a first and a second input of said current generating means, first and second outputs coupled to said first and second inputs of said charge pump, and a reset input coupled to said reset output of said first gate means.

5. The phase locked loop of claim 4 wherein said first gate means comprises a NAND gate.

6. The phase locked loop of claim 4 wherein said latch means comprises:
   second gate means having a first input coupled to said first input of said current generating means, a second input, and an output coupled to said first input of said charge pump;
   third gate means having a first input coupled to said output of said second gate means, a second input coupled to said reset output of said first gate means, and an output coupled to said second input of said second gate means;
   fourth gate means having a first input coupled to said reset output of said first gate means, a second input, and an output; and
   fifth gate means having a first input coupled to said output of said fourth gate means, a second input coupled to said second input of said current generating means, and an output coupled to said second input of said charge pump and to said second input of said fourth gate means.

7. The phase locked loop of claim 6 wherein said second, third, fourth, and fifth gate means are NAND gates.

* * * * *